(12) United States Patent
Pagaila et al.

(10) Patent No.: US 7,859,085 B2
(45) Date of Patent: Dec. 28, 2010

(54) SEMICONDUCTOR DEVICE AND METHOD OF FORMING EMBEDDED PASSIVE CIRCUIT ELEMENTS INTERCONNECTED TO THROUGH HOLE VIAS

(75) Inventors: Reza A. Pagaila, Singapore (SG); Byung Tai Do, Singapore (SG); Yaojian Lin, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/627,884

(22) Filed: Nov. 30, 2009

(65) Prior Publication Data

US 2010/0072570 A1 Mar. 25, 2010

Related U.S. Application Data

(62) Division of application No. 12/127,472, filed on May 27, 2008, now Pat. No. 7,648,911.

(51) Int. Cl.
*H01L 29/40* (2006.01)
*H01L 21/44* (2006.01)

(52) U.S. Cl. .................. 257/621; 257/698; 438/667

(58) Field of Classification Search ............ 438/113, 438/629, 667, 675; 257/621, 698, E23.141–E23.179
See application file for complete search history.

(56) References Cited

U.S. PATENT DOCUMENTS

| | | | |
|---|---|---|---|
| 6,420,244 B2 | 7/2002 | Lee | |
| 6,495,912 B1 | 12/2002 | Huang et al. | |
| 6,852,607 B2 | 2/2005 | Song et al. | |
| 6,911,392 B2 | 6/2005 | Bieck et al. | |
| 7,361,532 B2 * | 4/2008 | Fukazawa | 438/113 |
| 7,648,911 B2 * | 1/2010 | Pagaila et al. | 438/667 |
| 2004/0245623 A1 | 12/2004 | Hara et al. | |
| 2005/0046002 A1 | 3/2005 | Lee et al. | |
| 2008/0001285 A1 | 1/2008 | Yang | |

* cited by examiner

*Primary Examiner*—Calvin Lee
(74) *Attorney, Agent, or Firm*—Robert D. Atkins

(57) ABSTRACT

A semiconductor die has a first insulating material disposed around a periphery of the die. A portion of the first insulating material is removed to form a through hole via (THV). Conductive material is deposited in the THV. A second insulating layer is formed over an active surface of the die. A first passive circuit element is formed over the second insulating layer. A first passive via is formed over the THV. The first passive via is electrically connected to the conductive material in the THV. The first passive circuit element is electrically connected to the first passive via. A third insulating layer is formed over the first passive circuit element. A second passive circuit element is formed over the third insulating layer. A fourth insulating layer is formed over the second passive circuit element. A plurality of semiconductor die is stacked and electrically interconnected by the conductive via.

24 Claims, 10 Drawing Sheets

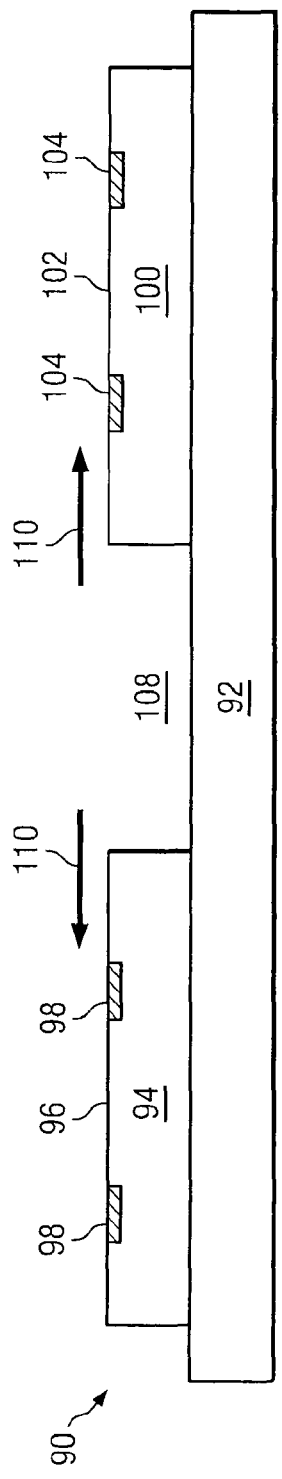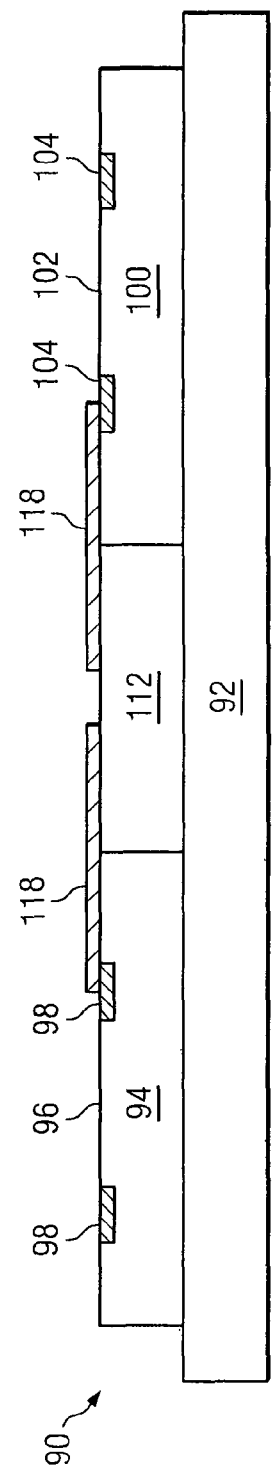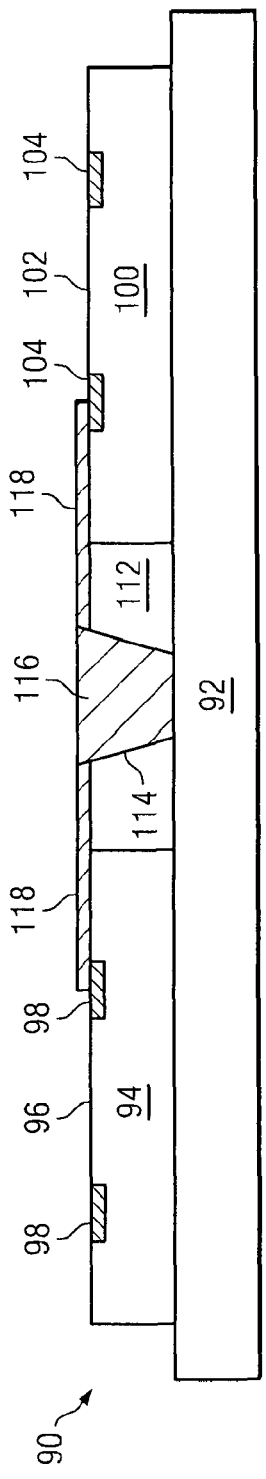

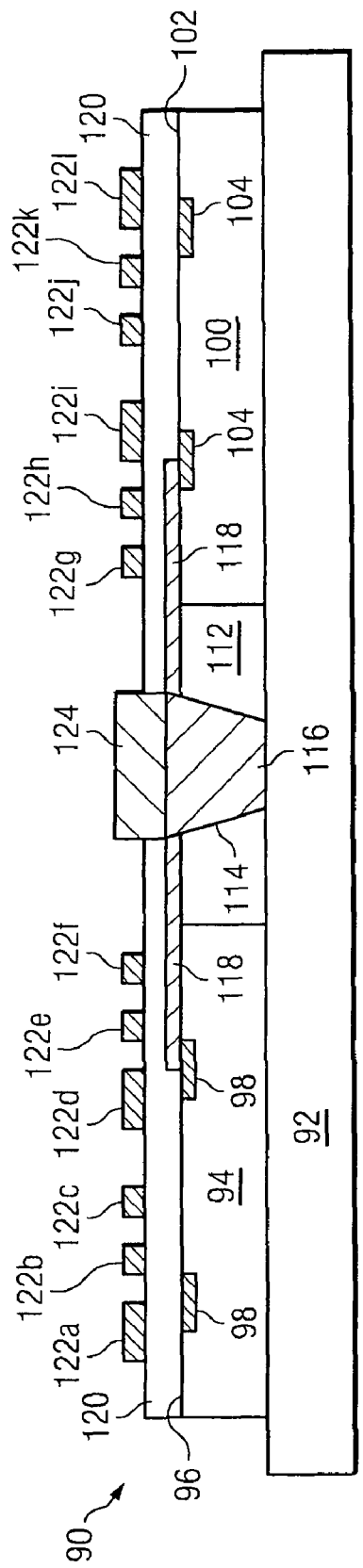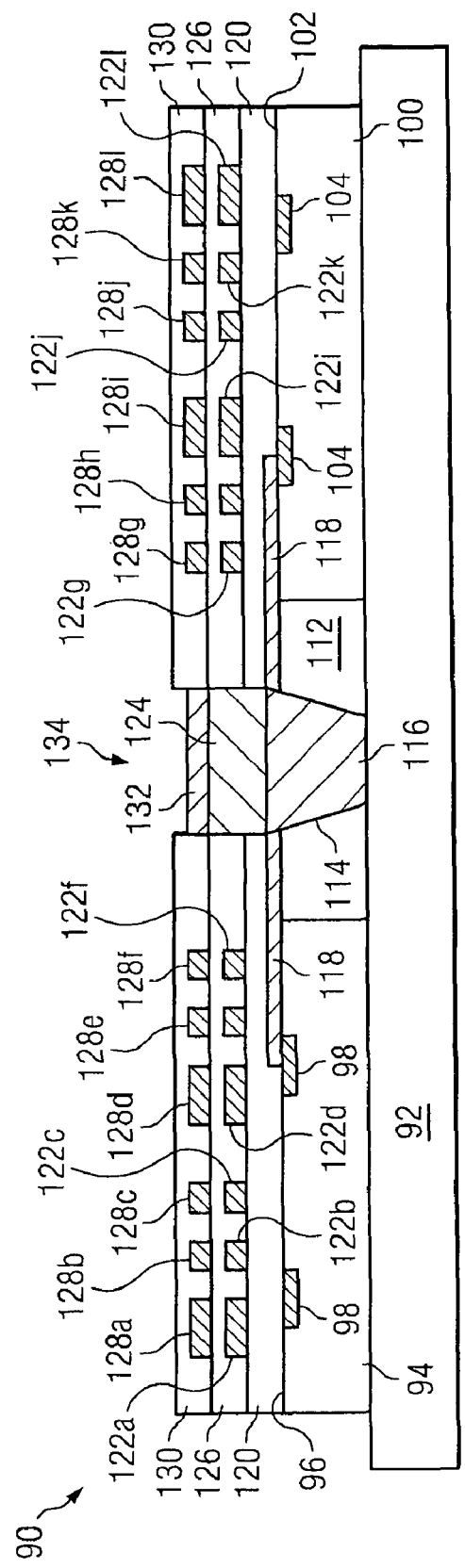

SEMICONDUCTOR DEVICE AND METHOD OF FORMING EMBEDDED PASSIVE CIRCUIT ELEMENTS INTERCONNECTED TO THROUGH HOLE VIAS

CLAIM TO DOMESTIC PRIORITY

The present application is a division of, claims priority to, and fully incorporates herein by reference U.S. patent application Ser. No. 12/127,472, filed May 27, 2008.

FIELD OF THE INVENTION

The present invention relates in general to semiconductor devices and, more particularly, to a semiconductor device having embedded passive circuit elements interconnected to conductive through hole vias in a periphery area of the die.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In high frequency applications, such as radio frequency (RF) wireless communications, integrated passive devices (IPD) are often contained within the semiconductor device. The passive circuit elements include inductors, capacitors, and resistors formed on the semiconductor die. A typical RF system requires multiple IPDs on multiple semiconductor devices to perform the necessary electrical functions.

Passive circuit elements are often mounted to a printed circuit board, which can create long electrical connection paths between active circuitry on the semiconductor die and passive devices. The long conduction paths reduces electrical performance, particularly in high frequency applications. Moreover, mounting passive circuit elements on the printed circuit board consumes area and limits the ability to miniaturize the system.

In many applications, it is desirable to vertically stack semiconductor die for greater device integration and minimize interconnect routing. The electrical interconnection between stacked semiconductor die has been done by using through hole vias which traverse from a front side to the backside of the die. The through hole vias are formed by drilling through the active area of the die or through saw streets on the wafer prior to any dicing operation. The through hole vias are filled with conductive material. The process of drilling through hole vias in the active area of the die or in saw streets on the wafer can cause damage to the wafer and/or die.

SUMMARY OF THE INVENTION

A need exists to interconnect stacked semiconductor die with conductive vias and provide for passive circuit elements within the semiconductor die to reduce conduction paths and increase electrical performance. Accordingly, in one embodiment, the present invention is a semiconductor device comprising a semiconductor die having a peripheral region and first insulating material deposited in the peripheral region of the semiconductor die. A conductive THV is formed in the first insulating material. A conductive layer is formed over the semiconductor die and first insulating material to electrically connect the conductive THV to a contact pad on the semiconductor die. A first insulating layer is formed over an active surface of the semiconductor die. A first passive circuit element is formed over the first insulating layer. A first passive via is formed on the conductive THV. The first passive circuit element is electrically connected to the conductive THV through the first passive via.

In another embodiment, the present invention is a semiconductor device comprising a semiconductor die and first insulating layer formed around the semiconductor die. A conductive THV is formed in the first insulating layer. A second insulating layer is formed over an active surface of the semiconductor die. A first passive circuit element is formed over the second insulating layer.

In another embodiment, the present invention is a semiconductor device comprising a semiconductor die and first insulating layer formed around the semiconductor die. A conductive THV is formed in the first insulating layer. A second insulating layer is formed over an active surface of the semiconductor die. A first passive circuit element is formed over the second insulating layer. A first conductive layer is formed over the conductive THV. The first passive circuit element is electrically connected to the conductive THV through the first conductive layer.

In another embodiment, the present invention is a semiconductor device comprising a semiconductor die and first insulating layer formed around the semiconductor die. A conductive THV is formed in the first insulating layer. A first passive circuit element is formed over the active surface of the semiconductor die. A first conductive layer is formed over the conductive THV. The first passive circuit element is electrically connected to the conductive THV through the first conductive layer.

BRIEF DESCRIPTION OF THE DRAWINGS

FIGS. 3a-3h illustrate a process of forming IPDs over the active surface interconnected to conductive vias formed in the saw street around a periphery of the die;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
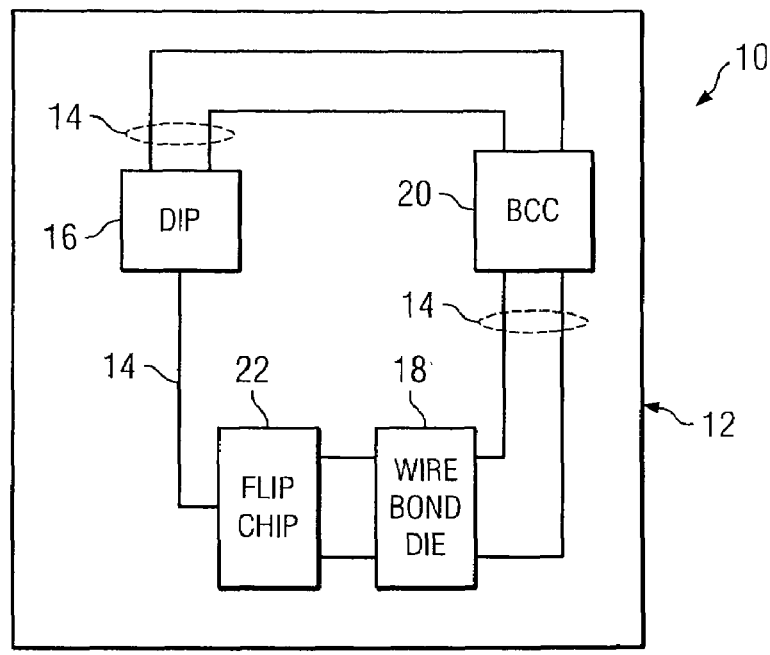
FIG. 1 illustrates a PCB with different types of packages mounted to its surface.

FIG. 1 illustrates electronic device 10 having a chip carrier substrate or printed circuit board (PCB) 12 with a plurality of semiconductor packages or semiconductor die mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components.

In FIG. 1, PCB 12 provides a general substrate for structural support and electrical interconnect of the semiconductor packages and other electronic components mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and any connected external system components. Traces 14 also provide power and ground connections to each of the semiconductor packages.

For the purpose of illustration, several types of semiconductor packages, including a dual in-line package (DIP) 16, wire-bonded die 18, bump chip carrier (BCC) 20, and flip-chip package 22, are shown mounted on PCB 12. Depending upon the system requirements, any combination of semiconductor packages or other electronic components can be connected to PCB 12. In some embodiments, electronic device 10 includes a single attached semiconductor package, while other embodiments call for multiple interconnected packages. By combining one or more semiconductor packages over a single substrate, manufacturers can incorporate premade components into electronic devices and systems. Because the semiconductor packages include sophisticated functionality and represent known good units (KGUs), electronic devices can be manufactured using cheaper components and shorten manufacturing process. The resulting devices are less likely to fail and less expensive to manufacture resulting in lower costs for consumers.

Figure 2A:
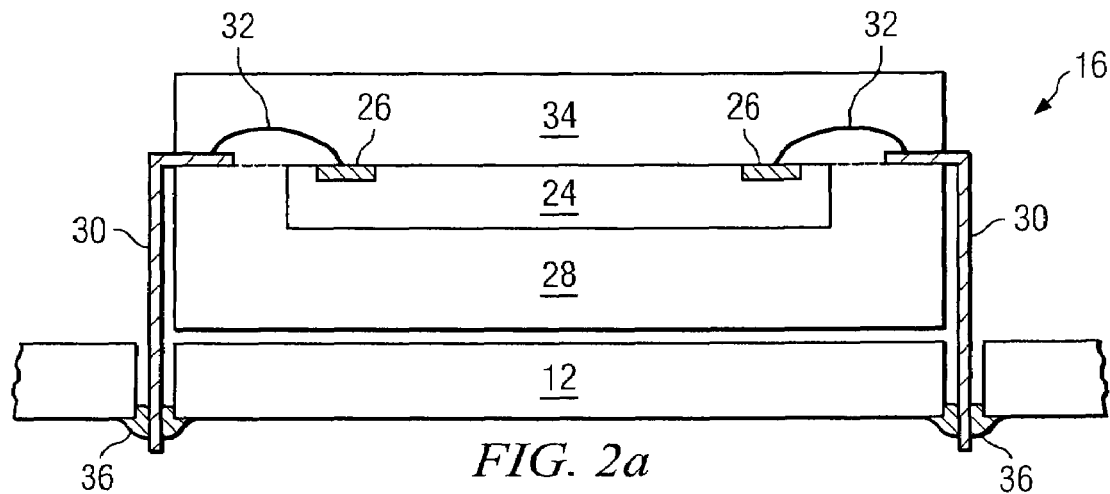
FIGS. 2a-2d illustrates further detail of the semiconductor packages mounted to the PCB.

FIG. 2a illustrates further detail of DIP 16 mounted on PCB 12. DIP 16 includes semiconductor die 24 having contact pads 26. Semiconductor die 24 includes an active area containing analog or digital circuits implemented as active devices, passive devices, conductive layers, and dielectric layers formed within semiconductor die 24 and are electrically interconnected according to the electrical design of the die. For example, the circuit may include one or more transistors, diodes, inductors, capacitors, resistors, and other circuit elements formed within the active area of die 24. Contact pads 26 are made with a conductive material such as aluminum (Al), copper (Cu), tin (Sn), nickel (Ni), gold (Au), or silver (Ag), and are electrically connected to the circuit elements formed within die 24. Contact pads 26 are formed by a physical vapor deposition (PVD), chemical vapor deposition (CVD), electrolytic plating, or electroless plating process. During assembly of DIP 16, semiconductor die 24 is mounted to a die attach area of lower portion 28 of the package body using a gold-silicon eutectic layer or adhesive material, such as thermal epoxy. The package body includes an insulative packaging material such as plastic or ceramic. Conductor leads 30 are connected to lower portion 28 of the body and wirebonds 32 are formed between leads 30 and contact pads 26 of die 24. Encapsulant 34 is deposited over the package for environmental protection by preventing moisture and particles from entering the package and contaminating die 24, contact pads 26, or wirebonds 32. DIP 16 is connected to PCB 12 by inserting leads 30 into holes formed through PCB 12. Solder material 36 is flowed around leads 30 and into the holes to physically and electrically connect DIP 16 to PCB 12. Solder material 36 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 2B:
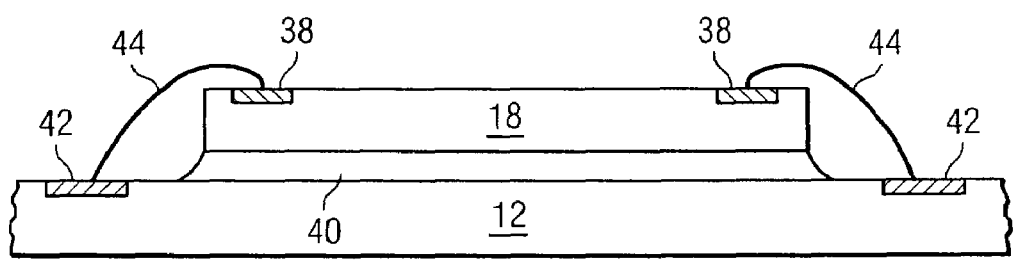

Referring to FIG. 2b, a wire bonded die 18 having contact pads 38 is mounted to PCB 12 using adhesive 40. Contact pads 42 are formed on the surface of PCB 12 and electrically connect to one or more traces 14 formed on or within the layers of PCB 12. Wirebonds 44 are formed between contact pads 38 of die 18 and contact pads 42 of PCB 12.

Figure 2C:
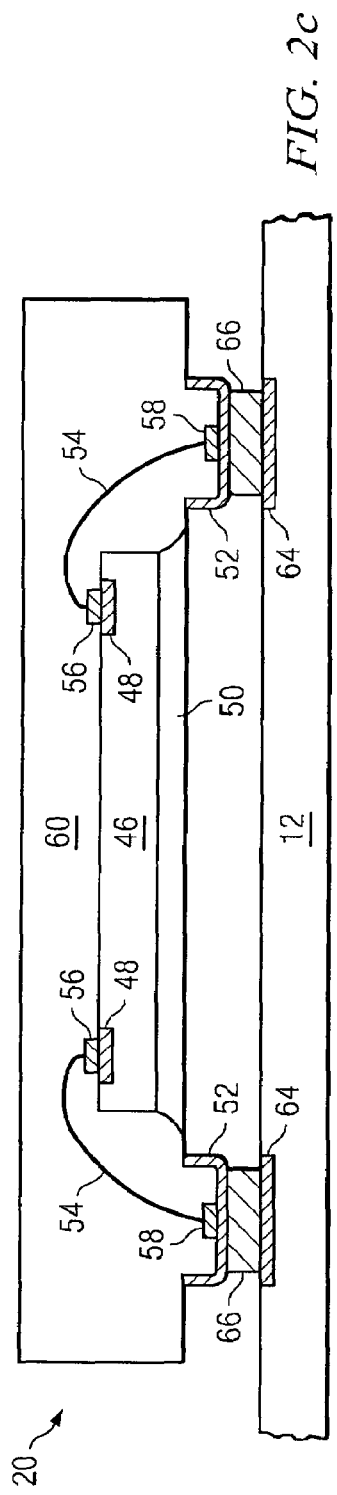

FIG. 2c illustrates further detail of BCC 20 with an incorporated semiconductor die, integrated circuit (IC), or combination thereof. Semiconductor die 46 having contact pads 48 is mounted over a carrier using an underfill or epoxy-resin adhesive 50. Semiconductor die 46 includes an active area containing analog or digital circuits implemented as active devices, passive devices, conductive layers, and dielectric layers formed within semiconductor die 46 and are electrically interconnected according to the electrical design of the die. For example, the circuit may include one or more transistors, diodes, inductors, capacitors, resistors, and other circuit elements formed within the active area of die 46. Contact pads 48 are connected to the electrical devices and circuitry formed within the active area of die 46. Wirebonds 54 and bond pads 56 and 58 electrically connect contact pads 48 of die 46 to contact pads 52 of BCC 20. Mold compound or encapsulant 60 is deposited over die 46, wirebonds 54 and contact pads 52 to provide physical support and electrical insulation for the device. Contact pads 64 are formed on PCB 12 and electrically connect to one or more conductive signal traces 14. Solder material is deposited between contact pads 52 of BCC 20 and contact pads 64 of PCB 12. The solder material is ref lowed to form bumps 66 which form a mechanical and electrical connection between BCC 20 and PCB 12.

Figure 2D:
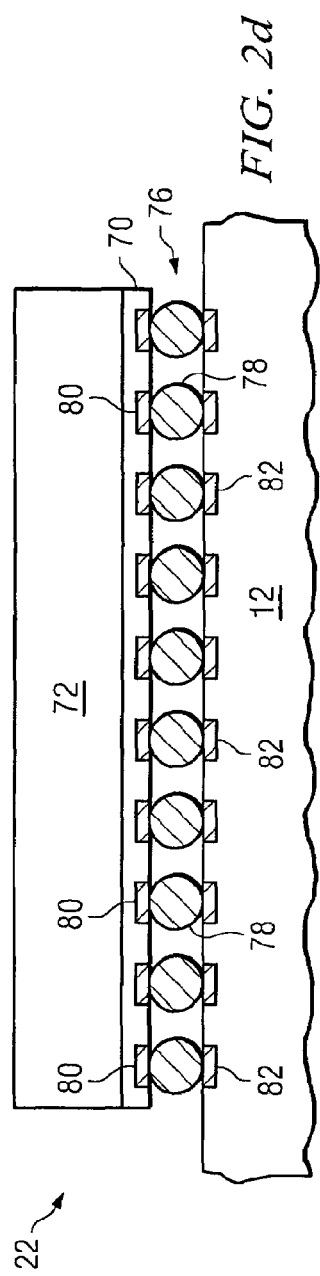

In FIG. 2d, flip chip style semiconductor device 22 has a semiconductor die 72 with active area 70 mounted face down toward PCB 12. Active area 70 containing analog or digital circuits implemented as active devices, passive devices, conductive layers, and dielectric layers formed within semiconductor die 72 is electrically interconnected according to the electrical design of the die. For example, the circuit may include one or more transistors, diodes, inductors, capacitors, resistors, and other circuit elements formed within active area 70 of die 72. The electrical and mechanical interconnect is achieved through solder bump structure 76 comprising a large number of individual conductive solder bumps or balls 78. The solder bumps are formed on bump pads or interconnect sites 80, which are disposed on active area 70. The bump pads 80 connect to the active circuits by conduction tracks in active area 70. The solder bumps 78 are electrically and mechanically connected to contact pads or interconnect sites 82 on PCB 12 by a solder reflow process. The interconnect sites 82 are electrically connected to one or more conductive signal traces 14 on PCB 12. The flip chip semiconductor device provides a short electrical conduction path from the active devices on die 72 to conduction tracks on PCB 12 in order to reduce signal propagation distance, lower capacitance, and achieve overall better circuit performance.

Figure 3A:
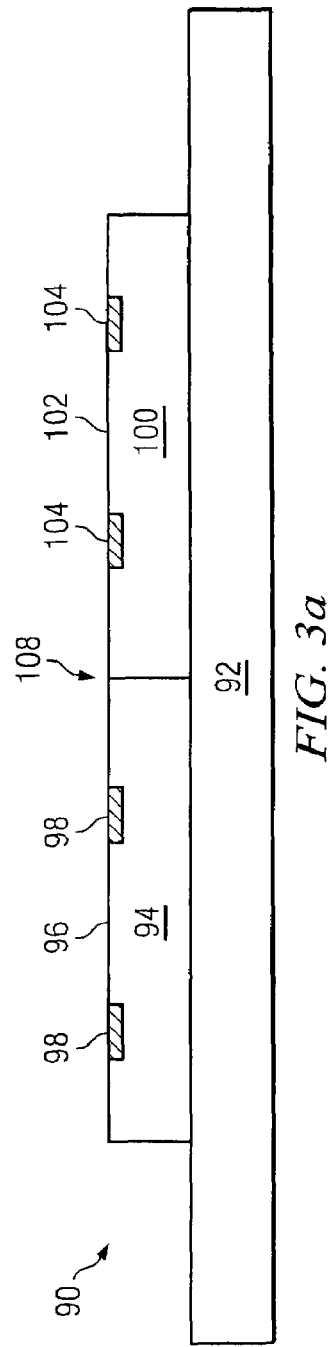

FIGS. 3a-3h illustrate a process of forming conductive vias on a periphery of a semiconductor die in a wafer level chip scale package (WLCSP). To start the process, a plurality of semiconductor die is formed on a semiconductor wafer 90 using conventional integrated circuit processes, as described above. The semiconductor wafer, containing semiconductor die 94 and 100, is mounted to expansion table 92 with ultraviolet (UV) tape, as shown in FIG. 3a. The backside of semiconductor die 94 is affixed to expansion table 92 with its active surface 96 and contact pads 98 oriented face up. Likewise, the backside of semiconductor die 100 is mounted to expansion table 92 with its active surface 102 and contact pads 104 oriented face up. Contact pads 98 and 104 electrically connect to active and passive devices and signal traces in active areas 96 and 102 of semiconductor die 94 and 100, respectively.

In FIG. 3b, a saw blade or laser tool cuts through saw street 108 of semiconductor die 94 and 100 in a dicing operation. Expansion table 92 moves in two-dimension lateral directions, as shown by arrows 110, to expand the width of saw street 108, i.e., form a gap to create a greater physical separation between the die. Expansion table 92 moves substantially the same distance in the x-axis and y-axis to provide equal separation around a periphery of each die. The post-expansion width of saw street or gap 108 ranges from 5 micrometers (μm) to 200 μm. The expanded dimension depends on the design embodiment, i.e., half-via, full-via, single row via, or double/multiple row via. The expanded saw street or gap 108 defines a peripheral region around the semiconductor die.

In an alternate embodiment, the semiconductor wafer is diced to separate the semiconductor die. The individual semiconductor die are then transferred and affixed to a temporary chip carrier with an adhesive layer, e.g., thermal epoxy. The semiconductor die are placed on the chip carrier so as to have a predetermined separation gap. In general, the separation gap has sufficient width to form conductive vias within the gap, as described below.

In FIG. 3c, an organic insulating material 112 is deposited in gap 108 using spin coating, needle dispensing, or other suitable application process. Organic material 112 can be benzocyclobutene (BCB), polyimide (PI), or acrylic resin. Alternatively, other non-conductive materials such as a polymer molding compound, liquid epoxy molding, compression molding, soft laminating film, or other material having dielectric or electrical insulating properties can be deposited in gap 108. The non-conductive materials can also be deposited using a transfer molding or injection molding process.

An electrically conductive layer or redistribution layer (RDL) 118 is patterned and deposited on active surface 96 of semiconductor die 94 and active surface 102 of semiconductor die 100 using an evaporation, electrolytic plating, electroless plating, or other suitable metal deposition process. RDL 118 can be made with Al, Cu, Sn, Ni, Au, Ag, or other suitable conductive material.

In FIG. 3d, a portion of organic material 112 is removed by laser drilling or etching to create through hole via (THV) 114 extending down to expansion table 92. The walls of the remaining portion of organic material 112, which define THV 114, can be vertical or tapered.

An electrically conductive material 116 is deposited in THV 114 with an optional seed layer. Conductive material 116 can be Al, Cu, Sn, Ni, Au, or Ag. The seed layer can be made with Cu, Ni, nickel vanadium (NiV), Cu, Au, or Al. The seed layer and conductive material 116 are patterned and deposited using an electrolytic plating, electroless plating, sputtering, PVD, CVD, or other suitable metal deposition process. RDL 118 extends from contact pads 98 and 104 to conductive material 116.

In FIG. 3e, an insulating layer 120 is formed over RDL 118, conductive material 116, and semiconductor die 94 and 100. The insulating layer 120 can be made with silicon nitride (SiN), silicon dioxide (SiO2), silicon oxynitride (SiON), tantalum pentoxide (Ta2O5), zircon (ZrO2), aluminum oxide (Al2O3), polyimide (Pi), benzocyclobutene (BCE), polybenzoxazole (PBO), or other material having dielectric insulation properties. The deposition of insulating layer 120 may involve PVD, CVD, printing, and sintering or thermal oxidation and result in a thickness ranging from 100-5000 angstroms (Å). A portion of insulating layer 120 is removed by an etching process to expose conductive material 116.

An electrically conductive layer 122 is formed on insulating layer 120 using a patterning and deposition process. Conductive layer 122 has individual portions or sections 122a-122l to form integrated passive devices (IPD). The individual portions of conductive layers 122a-122l can be electrically common or electrically isolated depending on the connectivity of the individual semiconductor die 94 and 100. Conductive layer 122 can be made with Al, aluminum alloy, Cu, Sn, Ni, Au, Ag, or other electrically conductive material. Conductive layer 122 can have optional adhesion and barrier layers formed underneath or over the conductive layer. The adhesion and barrier layers can be titanium (Ti), titanium tungsten (TiW), titanium nitride (TiN), tantalum (Ta), or tantalum nitride (TaN). The deposition of conductive layer 122 uses PVD, CVD, electrolytic plating, or electroless plating processes.

The opening in insulating layer 120 is filled with conductive material 124. Conductive material 124 can be Al, Cu, Sn, Ni, Au, or Ag. The conductive material 124 is deposited using an electrolytic plating, electroless plating, sputtering, PVD, CVD, or other suitable metal deposition process. Conductive layer 124 is a first passive conduction via formed over conductive material 116 and makes electrical connection with conductive layer 122.

In FIG. 3f, a second insulating layer 126 is formed over insulating layer 120 and conductive layer sections 122a-122l. The insulating layer 126 can be made with SiN, SiO2, SiON, Ta2O5, ZrO2, Al2O3, Pi, BCB, PBO, or other material having dielectric insulation properties. The deposition of insulating layer 126 may involve PVD, CVD, printing, and sintering or thermal oxidation and result in a thickness ranging from 100-5000 Å. If necessary, a portion of insulating layer 126 is removed by an etching process to expose passive via 124.

An electrically conductive layer 128 is formed on insulating layer 126 using a patterning and deposition process. Conductive layer 128 has individual portions or sections 128a-128l. The individual portions of conductive layers 128a-128l can be electrically common or electrically isolated depending on the connectivity of the individual semiconductor die 94 and 100. Conductive layer 128 can be made with Al, aluminum alloy, Cu, Sn, Ni, Au, Ag, or other electrically conductive material. Conductive layer 128 can have optional adhesion and barrier layers formed underneath or over the conductive layer. The adhesion and barrier layers can be Ti, TiW, TiN, Ta, or TaN. The deposition of conductive layer 128 uses PVD, CVD, electrolytic plating, or electroless plating processes.

A protection layer 130 is formed over insulating layer 126, conductive layer sections 128a-128l, and conductive layer 124 for structural support and electrical isolation. The protection layer 130 can be photoresist, solder mask, or passivation material, such as SiN, Si3N4, SiO2, SiON, PI, BCB, PBO, epoxy-based polymers, or other insulating material. A portion of protection layer 130 is removed by an etching process to expose conductive layer 124.

The opening in protection layer 130 is filled with conductive material 132. Conductive material 132 can be Al, Cu, Sn, Ni, Au, or Ag. The conductive material 132 is deposited using an electrolytic plating, electroless plating, sputtering, PVD, CVD, or other suitable metal deposition process. Conductive layer 130 is a second passive conduction via formed over passive via 124 and makes electrical connection with conductive layer 128.

The individual sections 122a-122l and 128a-128l constitute one or more embedded passive circuit elements or IPDs formed in insulating layers 120, 126 and protection layer 130. For example, conduction layers 122a and 128a, with the portion of insulating layer 126 between conductive layers 122a and 128a, can be a metal-insulator-metal (MIM) capacitor. Another IPD could be realized by patterning and depositing a resistive layer between conductive layers 122b and 122c. The resistive layer could be made with tantalum silicide (TaxSiy) or other metal silicides, TaN, nichrome (NiCr), TiN, or doped poly-silicon having a resistivity of about 5 to 100 ohm/sq. The conductive layers 122d, 122e, and 122f may function as an inductor. The inductor layers are typically wound or coiled in plan-view, as shown by regions 122d-122f in the cross-sectional view of FIG. 3f, to produce or exhibit the desired inductive properties. Similar IPDs can be formed with one or more segments of conductive layers 122g-122l and 128a-128l. The thickness of the passive elements can be about 20 μm.

The IPDs contained within semiconductor die 94 and 100 provide the electrical characteristics needed for high frequency applications, such as high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device.

Conductive layers 122a-122l and 128a-128l electrically connect to conductive via 134 according to the electrical design of the die. The passive circuit elements are formed on insulating layers 120, 126 and protective layer 130 over the active surface of semiconductor die 94 and 100 to reduce the connection path to conductive via 134 and improve electrical performance. By forming THVs in organic material 112 on periphery of semiconductor die 94 and 100, the circuitry on semiconductor substrate can be designed without reserving die area for through silicon vias (TSV) in the active area of the die. The passive elements and semiconductor die are electrically connected by the conductive vias.

Figure 3G:
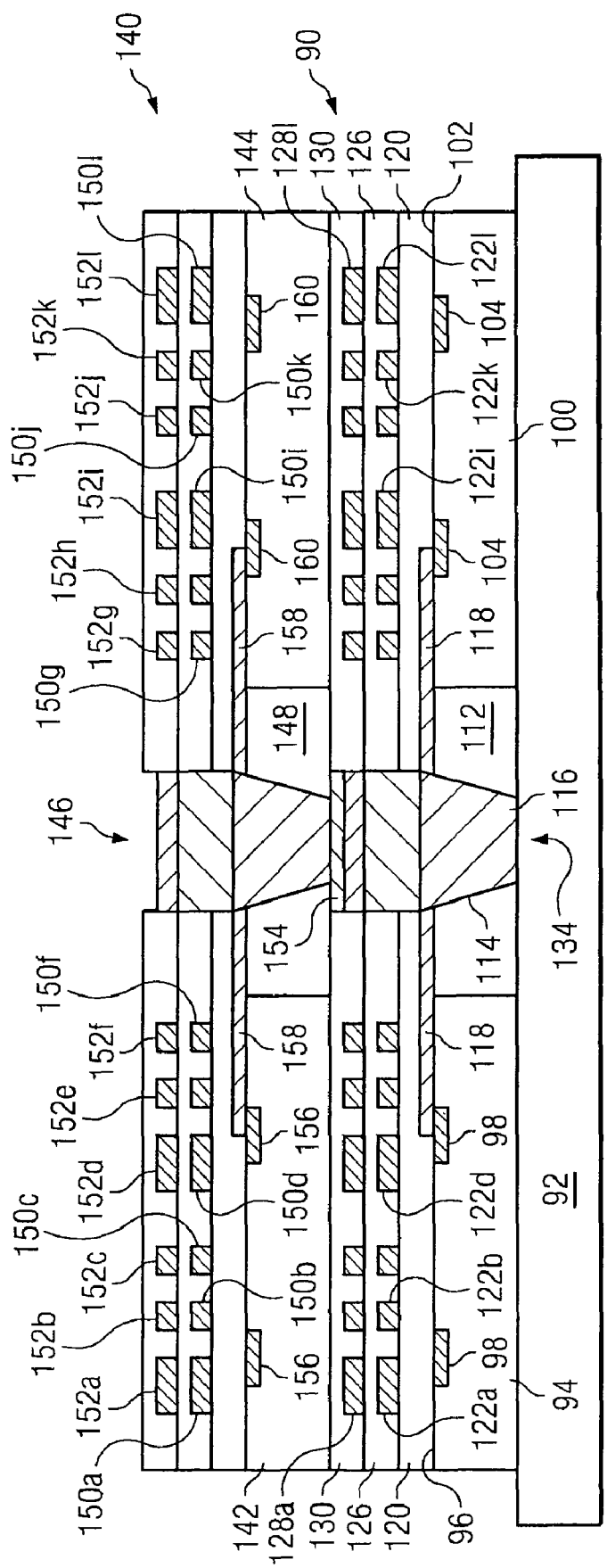

In FIG. 3g, a second semiconductor wafer 140 is made in a similar manner as semiconductor wafer 90. Semiconductor wafer 140 has semiconductor die 142 and 144. Conductive via 146 is formed in organic insulating material 148. Conductive layers 150a-150l and 152a-152l function as one or more IPDs and connect to conductive via 146. The IPDs 150a-150l and 152a-152l can be MIM capacitor, resistors, and inductors as described in FIG. 3f. Conductive via 146 electrically connects to conductive via 134 with conductive bonding agent 154, e.g., metal to metal bonding or conductive solder paste.

Accordingly, contact pads 98 of semiconductor die 94 electrically connect with IPDs 122a-122l and 128a-128l through conductive via 134, which in turn connects to contact pads 156 of semiconductor die 142 and contact pads 160 of semiconductor die 144 and IPDs 150a-150l and 152a-152l through conductive via 146 and conductive layer or RDL 158. IPDs 122a-122l and 128a-128l can electrically connect to IPDs 150a-150l and 152a-152l through conductive vias 134 and 146.

Figure 3H:
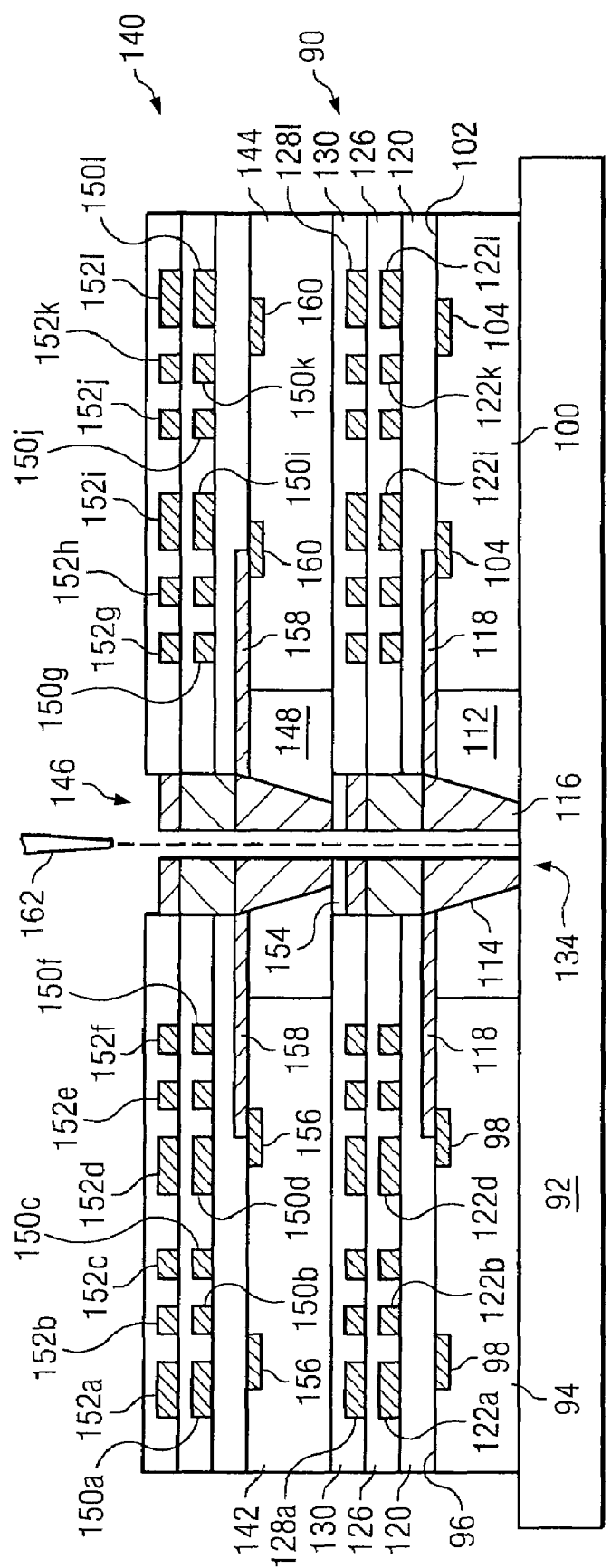

Semiconductor wafers 90 and 140 are singulated in FIG. 3h through a center portion of gap 108, i.e., through a center portion of the THVs to bisect conductive vias 134 and 146 and create conductive half-vias. The saw street or gap region is cut by a cutting tool 162 such as a saw blade or laser. The cutting tool completely severs the gap region to separate the die. The semiconductor die are removed from expansion table 92.

Figure 4:
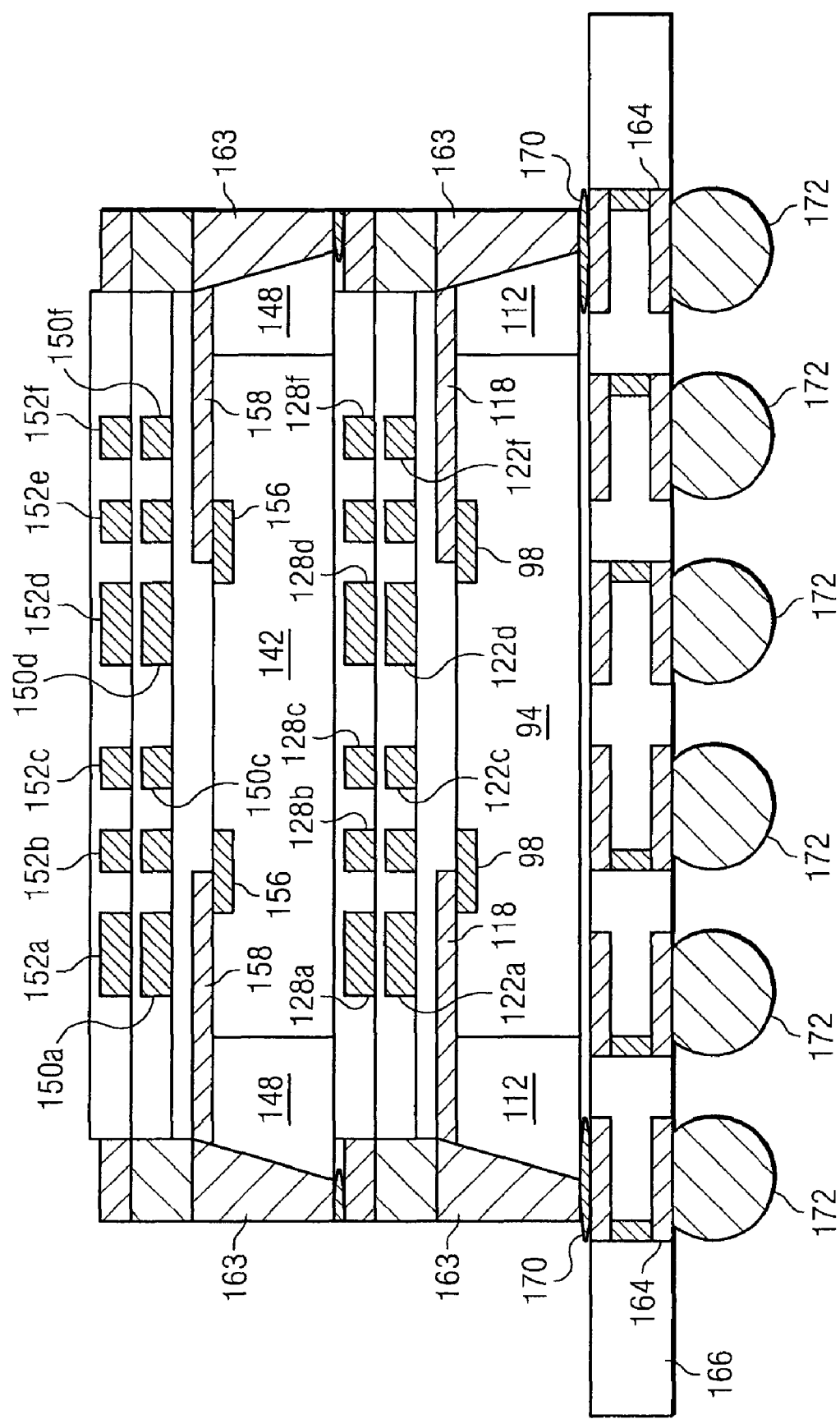
FIG. 4 illustrates vertically stacked semiconductor die with IPD interconnected by conductive half-vias and mounted to a substrate with interconnect structure.

FIG. 4 shows semiconductor die 94 and 142 with IPDs 122a-122f, 128a-128f, 150a-150f, and 152a-152f interconnected by conductive half-vias 163. Conductive half-vias 163 provide an electrical connection from one side of each die to the other side of the die. Semiconductor die 94 and 142 are mounted to substrate or printed circuit board (PCB) 166 such that conductive half-vias 163 electrically connect to interconnect structures 164 with bonding agents 170. An electrically conductive solder material is deposited over interconnect structures 164 using an evaporation, electrolytic plating, electroless plating, ball drop, or screen printing process. The solder material can be any metal or electrically conductive material, e.g., Sn, Ni, Au, Ag, Pb, Bi, and alloys thereof. For example, the solder material can be eutectic Sn/Pb, high lead, or lead free. The solder material is ref lowed by heating the solder material above its melting point to form spherical balls or bumps 172. In some applications, solder bumps 172 are ref lowed a second time to improve electrical contact to the interconnect sites.

Figure 5:
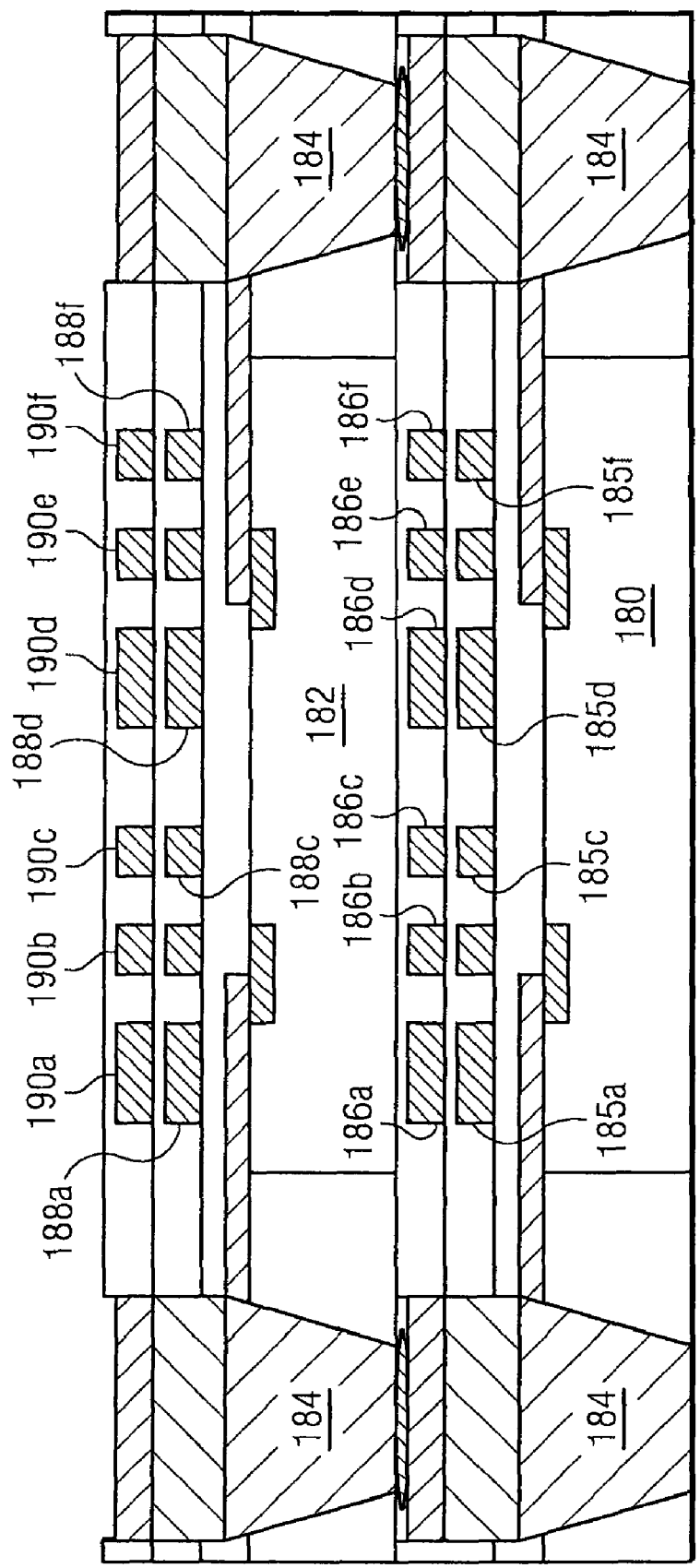
FIG. 5 illustrates vertically stacked semiconductor die with IPD interconnected by conductive full-vias.

In FIG. 5, semiconductor die 180 and 182 are shown with conductive full-vias 184 provide an electrical connection from one side of each die to the other side of the die. To form full-vias 184, gap 108 is made sufficiently wide to form two side-by-side THVs like 114 in FIG. 3b. The gap is filled with organic material 112. The two THVs 114 are separated by organic material 112 in gap 108. Both THVs 114 are filled with conductive material, as described in FIG. 3d. As a result, two side-by-side conductive vias are formed in gap 108, each surrounded by organic material 112. Conductive layers 185a-185f and 186a-186f are formed in insulating layers above die 180. Likewise, conductive layers 188a-188f and 190a-190f are formed in insulating layers above die 182. The conductive layers 185-190 function as IPDs, as described above. The cutting tool severs organic material 112 between the two conductive vias to provide full-vias 184. The contact pads of semiconductor die 180 electrically connect to conductive full-vias 184, which in turn electrically connect to the contact pads of semiconductor die 182 and IPDs 185-190.

Figure 6:
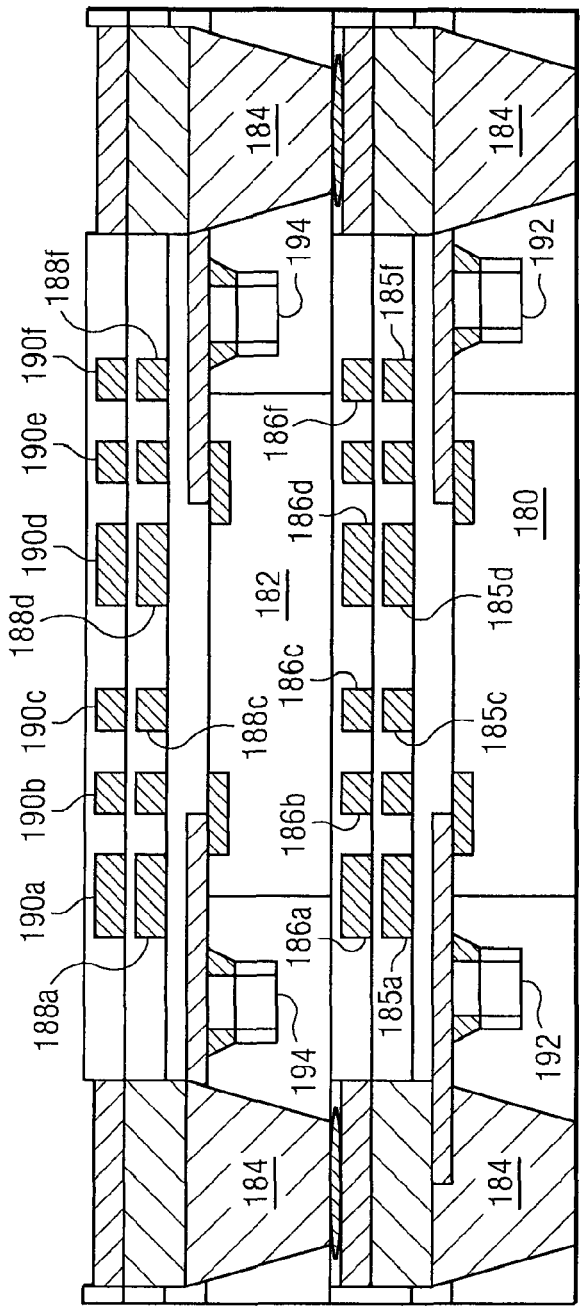
FIG. 6 illustrates vertically stacked semiconductor die with IPD interconnected by conductive vias and further having discrete circuit elements.

FIG. 6 is similar to the embodiment of FIG. 5 with the addition of discrete devices 192 disposed in the gap between conductive full-via 184 and semiconductor die 180, and discrete devices 194 disposed in the gap between conductive full-via 184 and semiconductor die 182. Discrete devices 192 and 194 electrically connect to conductive vias 184. Discrete devices 192 and 194 can be passive or active circuit components.

Figure 7:
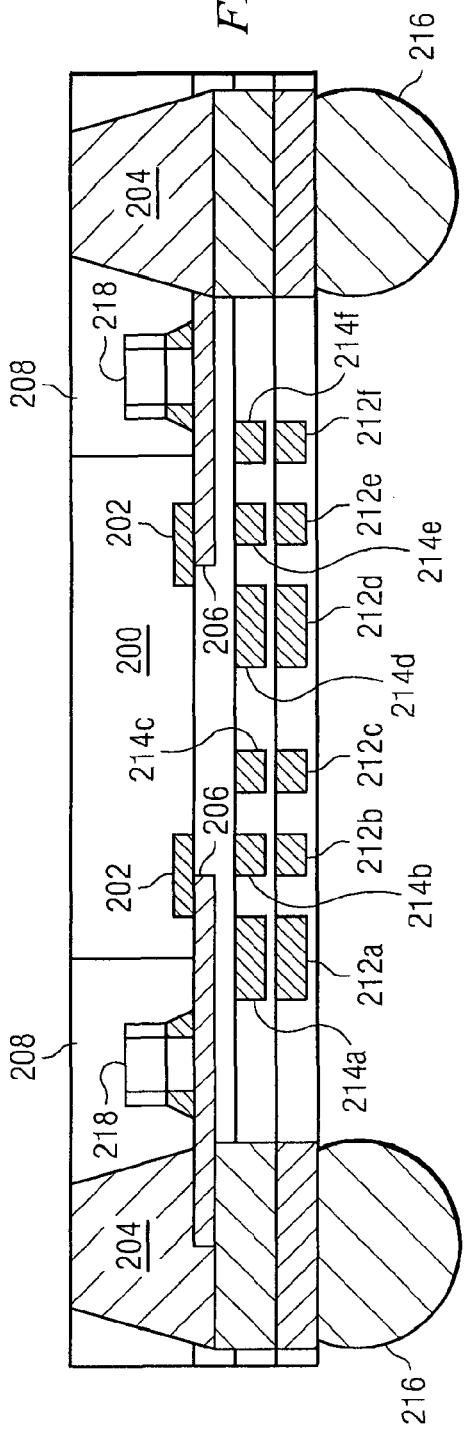
FIG. 7 illustrates fan-out WLP with conductive full-vias, IPD, and discrete circuit elements.

FIG. 7 shows a fan-out WLP structure with semiconductor die 200 having contact pads 202 electrically connected to conductive full-vias 204 by way of conductive layer 206. Conductive full-vias 204 are formed in organic material 208 as described in FIG. 5. Conductive layers 212a-212f and 214a-214f function as IPDs. Solder bumps 216 are formed on conductive vias 204 for electrical interconnect. Discrete devices 218 disposed in the gap between conductive full-via 204 and semiconductor die 200. Discrete devices 218 can be passive or active circuit components.

In another embodiment, multiple rows of conductive vias can be formed in the gap between the semiconductor die. The multiple rows can be full-vias or half-vias. Conductive half-vias are formed according to FIGS. 3a-3h; conductive full-vias are formed according to FIG. 5. The conductive vias provide an electrical connection from one side of each die to the other side of the die.

Figure 8:
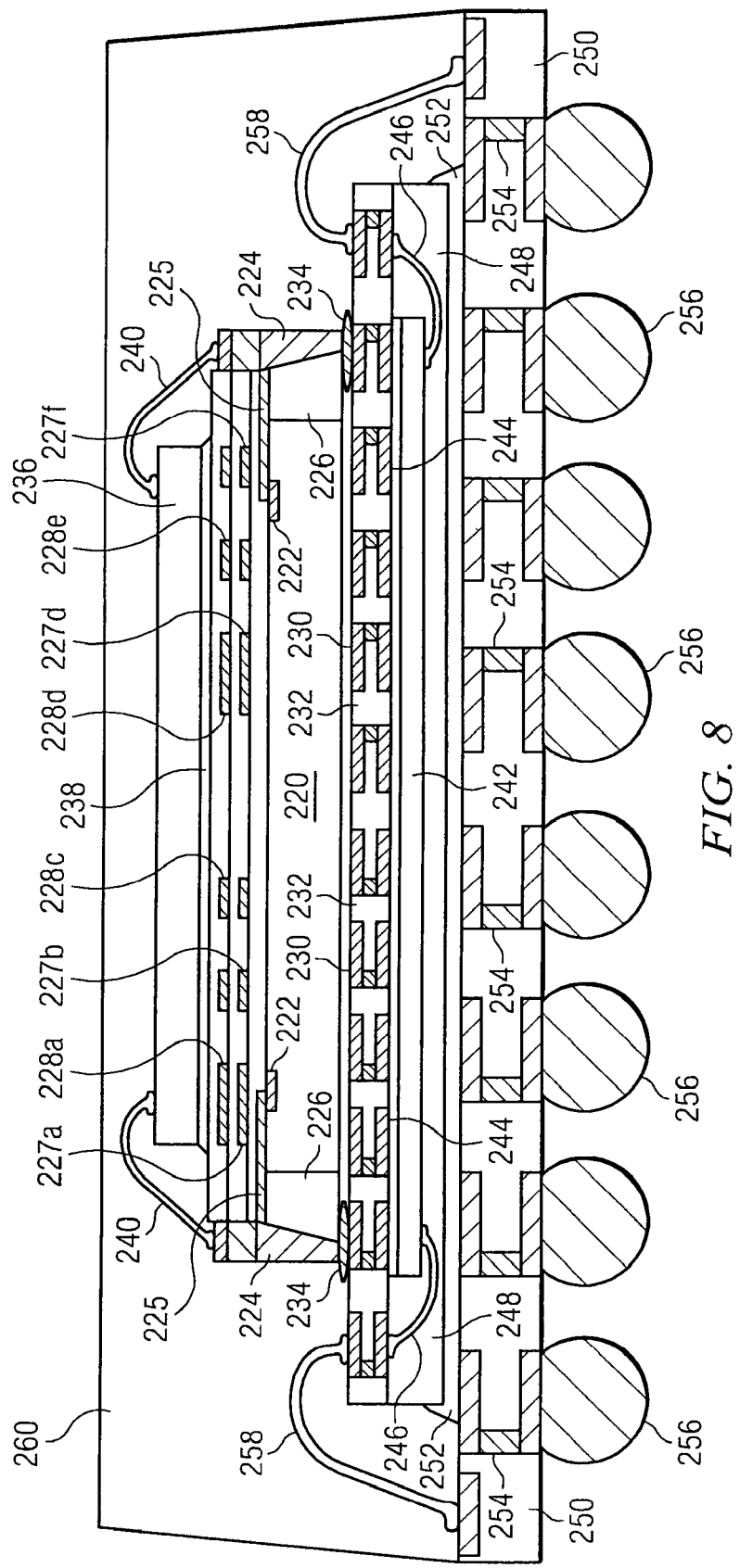
FIG. 8 illustrates a package-in-package with semiconductor die having IPD interconnected by conductive vias.

The aforedescribed semiconductor die with conductive vias formed along the gap can be readily integrated into a package-in-package (PiP) applications, as shown in FIG. 8. Semiconductor device 220 has contact pads 222. Contact pads 222 connect to conductive half-vias 224 by way of conductive layer 225. Conductive vias 224 are separated from device 220 by insulating material 226 in the gap of semiconductor die 220. Conductive layers 227a-227f and 228a-228f function as IPDs as described above. Conductive vias 224 further connect to interconnect structure 230 on substrate 232 with bonding agent 234. Semiconductor device 236 is mounted to semiconductor device 220 using adhesive layer 238. Semiconductor device 236 electrically connects to conductive vias 224 with bond wires 240. Semiconductor device 242 is mounted to a backside of substrate 232 using adhesive layer 244. Semiconductor device 242 electrically connects to interconnect structure 230 with bond wires 246. A molding compound or encapsulant 248 is deposited over semiconductor device 242 and bond wires 246. Molding compound 248 can be made with epoxy acrylate or other polymer material and applied by transfer molding, liquid encapsulant molding, or other molding process. Molding compound 248 is non-conductive and environmentally protects the semiconductor device from external elements and contaminants. In one embodiment, semiconductor devices 220, 236, and 242 are stacked memory devices.

The entire assembly 220-248 is mounted to substrate 250 with adhesive layer 252. An electrically conductive solder material is deposited over interconnect structure 254 on substrate 250 using an evaporation, electrolytic plating, electroless plating, ball drop, or screen printing process. The solder material can be any metal or electrically conductive material, e.g., Sn, Pb, Ni, Au, Ag, Cu, Bi, and alloys thereof. For example, the solder material can be eutectic Sn/Pb, high lead, or lead free. The solder material is reflowed by heating the solder material above its melting point to form solder bumps 256. In some applications, solder bumps 256 are reflowed a second time to improve electrical contact to interconnect structure 254. Bond wires 258 electrically connect interconnect structure 230 on substrate 232 with interconnect structure 254 on substrate 250. An encapsulant or molding compound 260 is formed over semiconductor devices 220 and 236, substrates 232 and 250, and bond wires 240 and 258. Conductive vias 224 perform an integrated part of the electrical interconnection between stacked semiconductor devices 220, 236, and 242 in the PiP.

The semiconductor die with conductive vias formed along the gap can also be integrated into fan-in package-on-package (Fi-PoP) applications.

The semiconductor die with IPDs interconnected by conductive vias offer several advantages. By forming the THV in organic materials around a periphery of the semiconductor die, no TSVs are needed which saves active die area. The passive circuit elements embedded in insulating layers above the active surface of the semiconductor die reduces space constraints of the printed circuit board which aids with miniaturization. The electrical performance is improved by connecting the embedded passive circuit elements to the conductive via and thereby reduce the conduction path between the active devices on the semiconductor die and passive circuit element.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a semiconductor die;
   a first insulating layer formed around the semiconductor die;
   a conductive through hole via (THV) formed in the first insulating layer;
   a conductive layer formed over the semiconductor die and first insulating layer to electrically connect the conductive THV to a contact pad on the semiconductor die;
   a second insulating layer formed over an active surface of the semiconductor die; and
   a first passive circuit element formed over the second insulating layer.

2. The semiconductor device of claim 1, further including a plurality of stacked semiconductor die electrically interconnected through the conductive THV.

3. The semiconductor device of claim 1, further including a discrete device disposed adjacent to semiconductor die and electrically connected to the conductive THV.

4. A semiconductor device, comprising:
   a semiconductor die;
   a first insulating layer formed around the semiconductor die;
   a conductive through hole via (THV) formed in the first insulating layer;
   a second insulating layer formed over an active surface of the semiconductor die;
   a first passive circuit element formed over the second insulating layer; and
   a first conductive layer formed on the conductive THV, the first passive circuit element being electrically connected to the conductive THV through the first conductive layer.

5. The semiconductor device of claim 4, further including:
   a third insulating layer formed over the first passive circuit element;
   a second passive circuit element formed over the third insulating layer; and
   a fourth insulating layer formed over the second passive circuit element.

6. The semiconductor device of claim 5, further including a second conductive layer formed on the first conductive layer, the second passive circuit element being electrically connected to the first conductive layer through the second conductive layer.

7. A semiconductor device, comprising:
   a semiconductor die having a peripheral region;
   a first insulating material deposited in the peripheral region of the semiconductor die;
   a conductive through hole via (THV) formed in the first insulating material;
   a conductive layer formed over the semiconductor die and first insulating material to electrically connect the conductive THV to a contact pad on the semiconductor die;
   a first insulating layer formed over an active surface of the semiconductor die;
   a first passive circuit element formed over the first insulating layer; and
   a first passive via formed on the conductive THV, the first passive circuit element being electrically connected to the conductive THV through the first passive via.

8. The semiconductor device of claim 7, further including:
   a second insulating layer formed over the first passive circuit element;
   a second passive circuit element formed over the second insulating layer; and
   a third insulating layer formed over the second passive circuit element.

9. The semiconductor device of claim 8, further including a second passive via formed on the first passive via, the second passive circuit element being electrically connected to the first passive via through the second passive via.

10. The semiconductor device of claim 7, wherein the peripheral region is singulated through the conductive THV to form a conductive half via.

11. The semiconductor device of claim 7, wherein the peripheral region is singulated through the first insulating material to form a conductive full via.

12. The semiconductor device of claim 7, further including a plurality of stacked semiconductor die electrically interconnected through the conductive THV.

13. The semiconductor device of claim 7, further including a discrete device disposed adjacent to semiconductor die and electrically connected to the conductive THV.

14. A semiconductor device, comprising:
   a semiconductor die;
   a first insulating layer formed around the semiconductor die;
   a conductive through hole via (THV) formed in the first insulating layer;
   a second insulating layer formed over an active surface of the semiconductor die;
   a first passive circuit element formed over the second insulating layer; and
   a first conductive layer formed over the conductive THV, the first passive circuit element being electrically connected to the conductive THV through the first conductive layer.

15. The semiconductor device of claim 14, further including a second conductive layer formed over the semiconductor die and first insulating layer to electrically connect the conductive THV to a contact pad on the semiconductor die.

16. The semiconductor device of claim 14, further including:
   a third insulating layer formed over the first passive circuit element;
   a second passive circuit element formed over the third insulating layer; and
   a fourth insulating layer formed over the second passive circuit element.

17. The semiconductor device of claim 16, further including a second conductive layer formed over the first conductive layer, the second passive circuit element being electrically connected to the first conductive layer through the second conductive layer.

18. The semiconductor device of claim 14, further including a plurality of stacked semiconductor die electrically interconnected through the conductive THV and first conductive layer.

19. A semiconductor device, comprising:
- a semiconductor die;
- a first insulating layer formed around the semiconductor die;
- a conductive through hole via (THV) formed in the first insulating layer;
- a first passive circuit element formed over the active surface of the semiconductor die; and
- a first conductive layer formed over the conductive THV, the first passive circuit element being electrically connected to the conductive THV through the first conductive layer.

20. The semiconductor device of claim 19, further including a second conductive layer formed over the active surface of the semiconductor die and first insulating layer to electrically connect the conductive THV to a contact pad on the semiconductor die.

21. The semiconductor device of claim 19, further including:
- a second insulating layer formed over the first passive circuit element;
- a second passive circuit element formed over the second insulating layer; and
- a third insulating layer formed over the second passive circuit element.

22. The semiconductor device of claim 21, further including a second conductive layer formed over the first conductive layer, the second passive circuit element being electrically connected to the first conductive layer through the second conductive layer.

23. The semiconductor device of claim 19, further including a plurality of stacked semiconductor die electrically interconnected through the conductive THV.

24. The semiconductor device of claim 19, further including a discrete device disposed adjacent to semiconductor die and electrically connected to the conductive THV.

* * * * *